(12) United States Patent
Shifman

(10) Patent No.: US 7,435,898 B2
(45) Date of Patent: Oct. 14, 2008

(54) SOLAR ENERGY UTILIZATION UNIT AND SOLAR ENERGY UTILIZATION SYSTEM

(75) Inventor: Eli Shifman, Hod Hasharon (IL)

(73) Assignee: Aerosun Technologies AG, Zug (CH)

( * ) Notice: Subject to any disclaimer, the term of this patent is extended or adjusted under 35 U.S.C. 154(b) by 661 days.

(21) Appl. No.: 10/939,357

(22) Filed: Sep. 14, 2004

(65) Prior Publication Data
US 2005/0046977 A1   Mar. 3, 2005

Related U.S. Application Data

(63) Continuation-in-part of application No. PCT/IL2004/000787, filed on Aug. 31, 2004.

(30) Foreign Application Priority Data
Sep. 2, 2003   (IL) .................................. 157716

(51) Int. Cl.
*H01L 31/00* (2006.01)
(52) U.S. Cl. ........................ 136/246; 136/259
(58) Field of Classification Search .......... 136/243–265
See application file for complete search history.

(56) References Cited

U.S. PATENT DOCUMENTS

| | | | |
|---|---|---|---|
| 4,086,485 A | 4/1978 | Kaplow et al. | |
| 4,131,485 A | 12/1978 | Meinel et al. | |
| 4,158,356 A | 6/1979 | Wininger | |
| 4,166,917 A | 9/1979 | Dorfeld | |
| 4,177,083 A * | 12/1979 | Kennedy | 136/259 |
| 4,297,000 A | 10/1981 | Fries | |
| 4,491,683 A | 1/1985 | Baranov et al. | |
| 4,683,348 A | 7/1987 | Pidgeon et al. | |
| 4,784,700 A | 11/1988 | Stern et al. | |
| 4,947,825 A | 8/1990 | Moriarty | |

(Continued)

OTHER PUBLICATIONS

N. Yehezkel et al, "Photovoltaic Conversion in a Common Solar Concentrating and Spectrally Splitting System", Proc. 1st WCPEC, p. 1811-1813, Dec. 1994.*

(Continued)

*Primary Examiner*—Alex Noguerola
*Assistant Examiner*—Jeffrey T Barton
(74) *Attorney, Agent, or Firm*—The Nath Law Group; Jerald L. Meyer; Sungyeop Chung

(57) ABSTRACT

A solar energy utilization unit comprises a solar radiation concentrating optics and a solar radiation receiver including first and second receiver components. The first receiver component is designed to convert into electric energy radiation in a first part of the solar spectrum, and the second receiver component is designed to convert into electric energy radiation in a second part of the solar spectrum different from said first part. The solar radiation concentrating optics comprises a concave primary reflector and a convex secondary reflector. The primary reflector is adapted to reflect incident solar radiation towards the secondary reflector, the secondary reflector is adapted to reflect radiation in the first part of the solar spectrum into the first receiver component and to transmit radiation in the second part of the solar spectrum into the second receiver component. The primary reflector is formed with a centrally disposed opening via which the first receiver component is adapted to receive the radiation reflected by the secondary receiver.

17 Claims, 4 Drawing Sheets

U.S. PATENT DOCUMENTS

| | | | |
|---|---|---|---|
| 5,062,899 | A | 11/1991 | Kruer |
| 5,089,055 | A | 2/1992 | Nakamura |
| 5,274,497 | A | 12/1993 | Casey |
| 5,962,850 | A | 10/1999 | Wüest |
| 2002/0139414 | A1* | 10/2002 | Vasylyev et al. ............ 136/246 |
| 2003/0037814 | A1* | 2/2003 | Cohen et al. ................ 136/246 |

OTHER PUBLICATIONS

Fraas, L.M., "Efficient Solar Photovoltaic Mirror Modules for Half the Cost of Today's Planar Modules", JX Crystals Inc., Pre-proposal Abstract (Sep. 8, 2004) for Energy Innovations Small Grant Program, 2 pages.

Fraas, L.M. "Path to Affordable Solar Electric Power & the 35% Efficient Solar Cell", JX Crystals Inc., 2004.

Fraas et al., "New Cassegrainian PV Module using Dichroic Secondary and Multijunction Solar Cells." JX Crystals Inc., Issaquah, Washington, USA.

Fraas et al., "New Cassegrainian PV Module using Dichroic Secondary and Multijunction Solar Cells." JX Crystals Inc., Issaquah, Washington, USA, date not available, Jun. 19, 2008.

* cited by examiner

SOLAR ENERGY UTILIZATION UNIT AND SOLAR ENERGY UTILIZATION SYSTEM

This application is a Continuation-in-Part of International Application No. PCT/IL2004/000787 filed Aug. 31, 2004.

FIELD OF THE INVENTION

This invention relates to the field of solar energy utilization systems and particularly, to such systems using solar radiation concentration optics of the cassegrainian type.

BACKGROUND OF THE INVENTION

A standard cassegrainian concentration optics comprises two reflectors, a primary reflector and a secondary reflector, which are coaxially aligned. The primary reflector captures and reflects incoming radiation to the generally smaller secondary reflector. The secondary reflector in turn reflects the radiation toward the focus of the concentration optics associated with a solar receiver. The primary and secondary reflectors may have different shapes, e.g. the primary reflector may be parabolic and the secondary reflector may be hyperbolic.

The solar receiver may be based on direct absorption of the heat of solar radiation by a working medium, e.g. water, or on a conversion of the solar radiation into another form of energy, e.g. as in photovoltaic cells, in which case the receiver is located with its entrance adjacent to or at the focus of the concentration optics. Alternatively, the receiver may be composed of a means for transmitting the concentrated radiation to a location spaced from the focal point, e.g. for use of solar energy in illumination systems.

Lewis M. Fraas describes in his *"PATH TO AFFORDABLE SOLAR ELECTRIC POWER"*, LX Crystals Inc., 2004, the use of two different receivers with cassegrainian concentration optics, in which the secondary reflector is in the form of a beam splitter, which reflects concentrated solar radiation in the visible part of the solar spectrum towards fiber optic light guide for piping the radiation to an indoor illumination system, and transmits concentrated solar radiation in the IR part of the solar spectrum towards an array of photovoltaic cells located behind the secondary reflector, for converting the radiation to electricity.

The efficiency of a cassegrainian solar concentrator is highly dependent on the quality of the reflectors' reflecting surfaces. Reflectors exposed to the environment for extended periods, tend to lose their reflection abilities due to, for example, dust or sand erosion, oxidation or corrosion. U.S. Pat. Nos. 4,166,917 and 4,491,683, both describe sealed solar collectors.

SUMMARY OF THE INVENTION

In accordance with the present invention there is provided a solar energy utilization unit with a solar radiation concentrating optics of a cassegrainian type, the unit being of a design allowing it to be manipulated by hand and modularly assembled in a solar energy utilization system, e.g. for domestic applications.

The solar energy utilization unit of the present invention comprises a solar radiation concentrating optics, designed to concentrate incident solar radiation and split it into at least two parts having wavelengths in different parts of the solar spectrum, and a solar radiation receiver including first and second solar radiation receiver components, the first component being adapted to convert to electricity incident radiation within a first, and the second component being adapted to convert to electricity incident radiation within a second, of said two parts of the solar spectrum.

The first and second receiver components each have a solar radiation receiving portion, preferably in the form of a photovoltaic structure, e.g. one or more photovoltaic cells, with sensitivity in the corresponding part of the solar spectrum. The two parts of the solar spectrum may, for example, be its visible and IR parts.

Each receiver component may comprise a concentrator, e.g. a non-imaging concentrator known per se, designed for admitting radiation from the solar radiation concentrating optics and forwarding it to the radiation receiving portion of the receiver component in a uniformly distributed manner. The concentrator may be in the form of a converging, e.g. frusto-conical, pipe with reflective internal surface, or a prism, within which radiation travels by means of total internal reflection.

The solar radiation concentrating optics has an optical axis and comprises a primary concave reflector and a secondary convex reflector whose centers and focal points are located along the optical axis. The secondary reflector is in the form of a spectral beamsplitter having two focal points, and it is designed to admit radiation concentrated by the primary reflector, to reflect towards its first focal point radiation in the first part of the solar spectrum, and to transmit towards the second focal point radiation in the second part of the solar spectrum, the first and second receiver components being respectively associated with the first and second focal points of the secondary reflector.

The primary reflector is formed with an opening in its center and the first focal point of the secondary reflector is normally disposed in or adjacent to the opening. The first receiver component is fixedly secured to the primary reflector's outer surface, so that either its radiation receiving portion or the concentrator associated therewith is disposed in or adjacent to the first focal point of the secondary reflector.

The secondary reflector has a convex surface facing the primary reflector, and its second focal point, which is located behind, has a convex surface, the second receiver component being fixedly secured behind the convex surface so that either its radiation receiving portion or the concentrator associated therewith is disposed in or adjacent to the second focal point of the secondary reflector.

In the case that any of the first and second receiver components include the concentrator, the latter may be formed integrally with its corresponding receiver component and/or with the reflector, primary or secondary, with which the receiver component is associated.

The second receiver component may further comprise a housing unit carrying the radiation receiving portion of the second receiver component, and the concentrator, if any, associated therewith.

Any or both of the first and second receiver components may further include a heat removal means to withdraw heat from the radiation receiving portion of the component. The heat removal means may be passive and be based on convection, which may be used in both receiver components; or they may be active and use cooling fluid, which may be particularly useful for the first receiver component.

By virtue of splitting the concentrated radiation into at least two parts and using corresponding receiver components, which are sensitive to these parts of radiation, to convert them into electric energy, and which are associated with different components (first and secondary reflectors) of the concentrating optics, in accordance with the present invention, a number of advantages may be achieved including:

the first and second receiver components may each be provided with a separate electric set up to operate at its optimal generated current;

the characteristics of the receiver components may be chosen and optimized, independently from each other, to enable better efficiency and lower production costs of the components;

each receiver component may perform at a different concentration level, which can be controlled by the design of the concentrator included in the component, whereby optimal concentration of radiation may be achieved for each receiver component and consequently maximum efficiency thereof;

heat removal from the radiation receiving portions of the receiver component is better manageable, since each receiving portion is only getting the part of the radiation spectrum applicable to it.

The solar energy utilization unit of the present invention may further comprise a rigid cover firmly and sealingly attached to the primary reflector, along the circumference of the latter, thereby forming a closed volume between the cover's inner surface and the inner, reflecting surface of the primary reflector with the solar radiation receiver component secured thereto. The unit may comprise means to control environment of the closed volume for minimizing deterioration of the quality of the reflectors.

The cover is made of a transparent material and it has a relatively small inoperative area whose inner surface is associated with the secondary reflector, either integrally formed therewith or fixedly attached thereto, and a relatively large operative area surrounding the reflector, via which area incident solar radiation passes towards the reflecting surface of the primary reflector.

The unit is preferably associated with a tracking mechanism that tracks the sun and it may comprise a self-aligning mechanism for additional precise alignment of the unit towards the sun.

The present invention further refers to a solar energy utilization system having a base plate and a plurality of solar unit seats adapted for detachably attaching a plurality of solar energy utilization units of the type described hereinabove, wherein in each unit the first and second receiver components are provided with their individual electric cables for withdrawing electricity therefrom, and wherein each unit is modular and is manufactured in mass production.

BRIEF DESCRIPTION OF THE DRAWINGS

In order to understand the invention and to see how it may be carried out in practice, particular embodiments will now be described, by way of non-limiting example only, with reference to the accompanying drawings, in which.

DETAILED DESCRIPTION OF THE INVENTION

Figure 1:
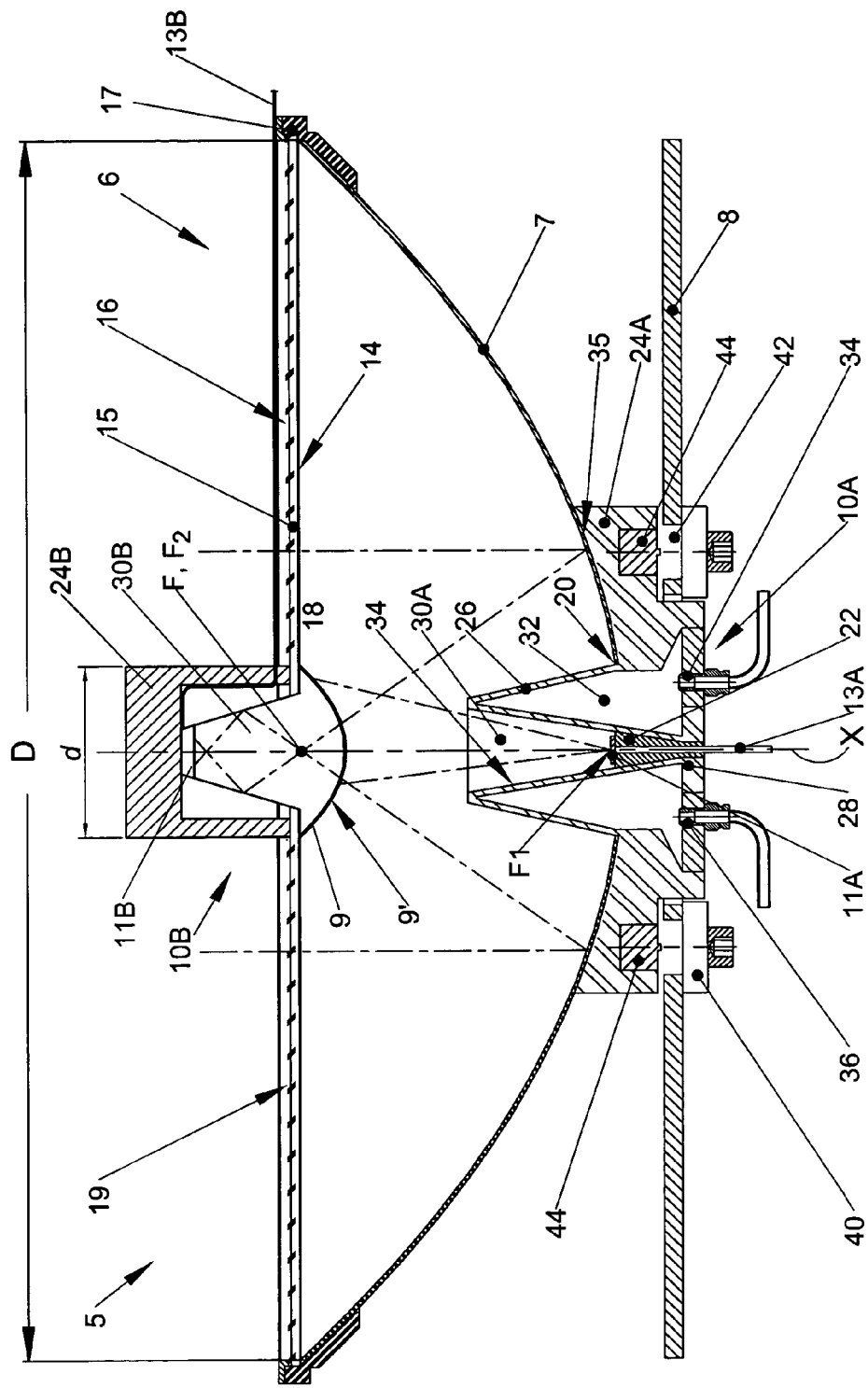
FIG. 1 is a schematic sectional view of a solar energy utilization unit according to one embodiment of the present invention.

FIG. 1 shows a solar energy utilization unit 5 in accordance with one embodiment of the present invention. The unit 5 comprises a solar radiation concentrating optics 6 including a concave primary reflector 7 and a convex secondary reflector 9, and a solar receiver designed to convert the radiation concentrated by the optics 6 into electric energy, the solar receiver comprising a first and second photovoltaic receiver components 10A and 10B, each associated with either primary reflector 7 or secondary reflector 9.

Each receiver component 10A, 10B comprises a photo-voltaic structure 11A, 11B, which may be a singular plate cell or an array of cells. The photo-voltaic structures 11A and 11B have different sensitivity wavebands, e.g. one of them is sensitive to radiation in the IR part of the solar spectrum and the other—in the visible part, and are designed to convert radiation within their corresponding wavebands into electric energy. The structures 11A and 11B are provided with electric cables 13A, 13B, respectively, attached thereto, for piping the electric energy to necessary location for utilization. The photo-voltaic structures 11A and 11B will be further referred to as 'photo-voltaic cells'.

The primary and secondary reflectors are arranged in a cassegrainian design, wherein the primary reflector 7 has a parabolic reflecting surface with a point of focus F. The secondary reflector 9 has a surface 9', facing the primary reflector, which is of a hyperbolic shape, and it has two points of focus F1 and F2 at different sides of the hyperbolic surface. The points of focus of both reflectors are located on a common optical axis X. The point of focus F of the primary reflector 7 coincides with the point of focus F2 of the secondary reflector 9.

The secondary reflector 9 is in the form of a beam splitter, which reflects towards its first focus F1 radiation in the sensitivity waveband of the photo-voltaic cell 11A, and which transmits towards the second focus F2 radiation in the sensitivity waveband of the photo-voltaic cell 11B.

Each receiver component 10A, 10B comprises a non-imaging concentrator whose entrance is located in or adjacent to the respective focus F1, F2 of the secondary reflector, designed for admitting radiation reflected or transmitted by the secondary reflector 9 and forwarding it to the respective photo-voltaic cell 11A, 11B in a uniformly distributed manner. The concentrator may be in the form of a converging, e.g such as a frusto-conical, pipe 30A with reflective internal surface, or in the form of a prism, e.g. such as prism 30B, within which radiation travels by means of total internal reflection.

The reflectors 7 and 9 have a circular symmetry around the axis X, the circumference of the primary reflector 7 having a diameter D and defining the circumference of the entire unit 5. The circumference of the secondary reflector has a diameter d, essentially smaller than the diameter D.

The unit 5 further comprises a rigid cover 15 made of a transparent material and having a rim 17 firmly and sealingly attached to the primary reflector 7 at the circumference of the latter, to form a closed volume between the cover 15 and the reflector 7. The closed volume may be filled with inert gas such as Nitrogen.

The cover 15 has an inner surface 14 facing the primary reflector 7 and the first receiver component 10A, an outer surface 16 generally facing the sun, an inoperative area 18 holding the secondary reflector 9 and the second receiver component 10B, and an operative area 19 surrounding them.

As seen in FIG. 1, the inoperative area 18 of the cover 15 is in the form of an aperture (not illustrated), and the secondary reflector 9 and the second receiver component 10B are formed as one unit mounted in the aperture. The second receiver component further comprises a housing 24B which serves as an insulating substrate and a protecting cover for the photovoltaic cell 11B, which is designed to enable passive cooling thereof.

The primary reflector 7 is formed with an opening 20 for mounting therein the solar radiation receiver component 10A.

The solar radiation receiver component 10A is made of a heat-conducting material and includes a centrally located cell-holding portion 22, a heat removal portion 26, at least a part of which surrounds the cell holding portion, and a peripherally disposed mounting arrangement 24A.

The cell holding portion 22 comprises a cell seat 28 protruding outwardly from the opening 20. The heat removal portion 26 protrudes inwardly from the opening 20 of the primary reflector 7, defining the frusto-conical pipe 30A, and it is formed with a cooling fluid cavity 32 surrounding the pipe 30A and adapted to provide contact of cooling fluid disposed therein with the cell seat 28 to withdraw heat therefrom.

The heat removal portion 26 is designed to be located in the shade, cast by the secondary reflector 9. The heat removal portion 26 has an inlet 34 and an outlet 36 connected with the cooling fluid cavity 32.

The unit mounting arrangement 24A includes a support surface 35 fixedly attached to the outer surface of the primary reflector 7 at areas thereof adjacent the aperture 20; means 40 preferably located at three peripheral areas of the solar radiation receiver component (of which only two are seen in FIG. 1), for mounting the unit 5 on the plate 8 with a possibility to independently adjust the distance therebetween; and a self-aligning mechanism 42 with any suitable adjustment means 44 adapted to perform the adjustment (e.g. step motors, electromagnets, etc.), to align the position of the unit 5 with respect to the sun.

For this purpose, the self-aligning mechanism 42 may comprise a sensor (not shown) located on the outer surface of the inoperative area 18 of the cover 15, and connected with the adjustment means 44 and a controller (not shown) to control the adjustment means, based on data received from the sensor. Alternatively, a sensing device can be designed as part of the receiver component 10, which will eliminate the need for the sensor 46.

In operation, the unit 5 mounted on the plate 8 tracks the sun and solar radiation passes through the operative area 19 of the transparent cover 15 to impinge upon the primary reflector 7 in a direction parallel to the axis X and is reflected thereby in the direction of its focus point F coinciding with the focal point F2 of the secondary reflector 9. One part of the radiation, which is within the sensitivity waveband of the first photo-voltaic cell 11A, is then reflected by the secondary reflector 9 towards its focal point F1, where the pipe 30A further concentrates it and directs it to the photo-voltaic cell 11A in a uniformly distributed manner. Radiation within the sensitivity waveband of the second photo-voltaic cell 11B is not reflected by the secondary reflector 9 but is rather transmitted thereby towards the focal point F2, where the prism 30B further concentrates it and directs it to the photo-voltaic cell 11B in a uniformly distributed manner.

A large amount of radiation concentrated in the area of the photo-voltaic cell 11A, in the first receiver component 10A, may cause a significant accumulation of heat around there, particularly in the cell seat 28. The heat removing part 26 functions as a heat-exchanger unit, by removing the heat from the cell seat 28 with the cooling fluid flowing from the inlet 34 to the outlet 36 through the cooling fluid cavity 32. Similarly, the photo-voltaic cell 11B is cooled by means provided in the housing 24B of the second receiver component 10B.

The unit 5 can be in a variety of dimensions but, for domestic use, it is preferably compact and easily handled. Such unit may have a diameter of approximately twenty two centimeters and a thickness of approximately seven centimeters, with the diameter d of the secondary reflector 9 being approximately 4.4 centimeters and the corresponding shaded area on the primary reflector 7 being only four percent of the area of the reflector 9.

The unit 5 may be unitarily manufactured in mass production and according to industrial standards of high precision. In particular, assembly of all its components into a precise, solid and durable construction may be performed at a relatively low cost.

The firm mounting of the secondary reflector 9 in the aperture of the rigid cover 15 and the firm attachment of the cover 15 to the primary reflector 7, assures that the desired alignment of the primary reflector 7 and the secondary reflector 9 can be easily achieved during the manufacturing process and can be maintained for the duration of the unit service period. In addition, the cover 15 facilitates keeping the surfaces of the reflectors 7 and 9 environmentally safe.

Thus, the use of the transparent rigid cover 15 is advantageous in both that it enables constructing the unit 5 as one unitary rigid member of precise dimensions and at the same time protects the reflectors, thereby enabling its extended service period.

Figure 2A:
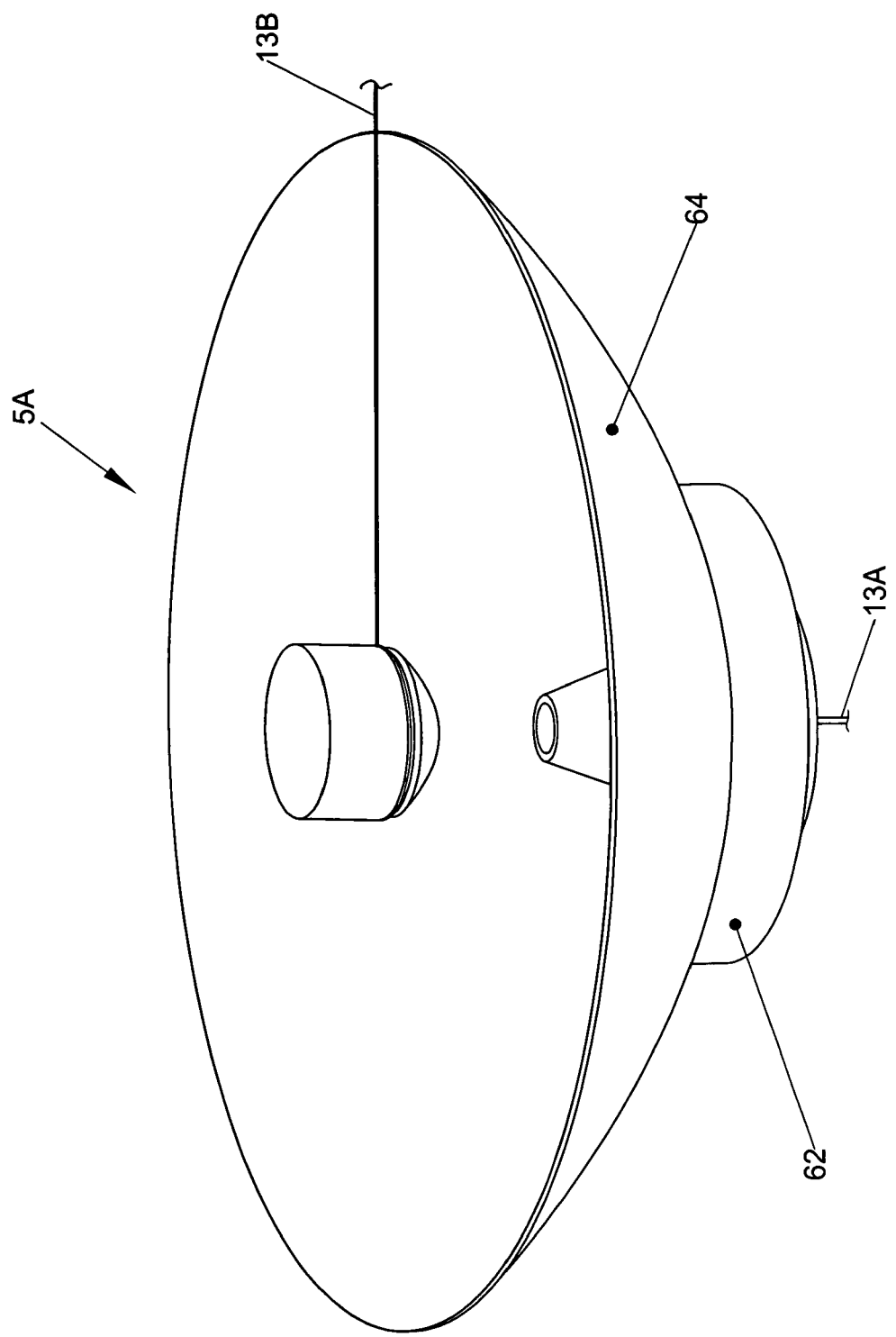
FIG. 2A is a schematic isometric view of the solar energy utilization unit shown in FIG. 1.
Figure 2B:
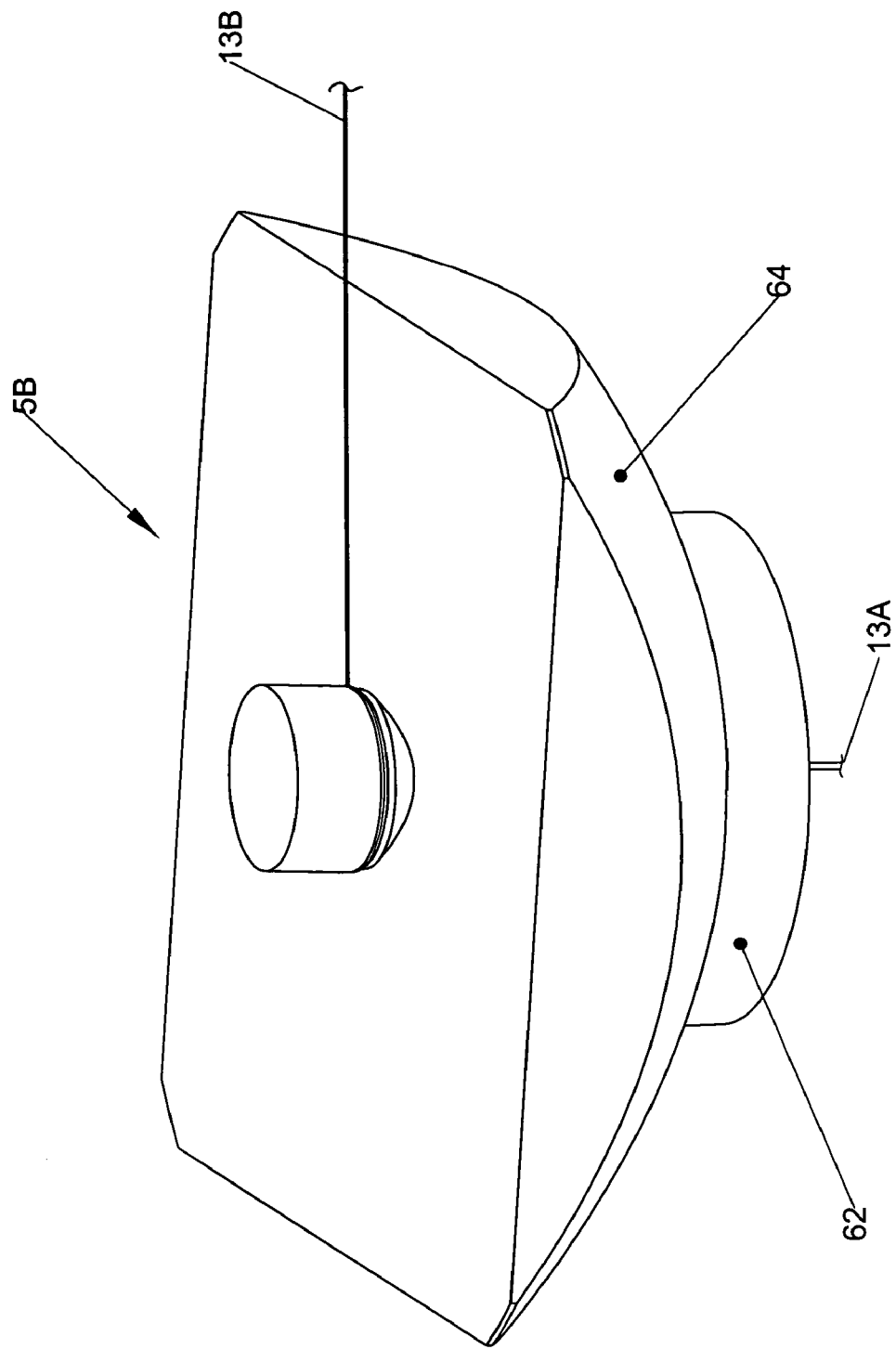
FIG. 2B is a schematic isometric view of a solar energy utilization unit according to an alternative embodiment of the present invention.

FIGS. 2A and 2B show two respective exemplary designs 5A and 5B of the solar energy utilization unit 5, which are identical except for the shape of their circumference. In the unit 5A this shape is circular and in the unit 5B it is square, the latter enabling a more efficient arrangement of a plurality of units in an array. Due to the concave shape of the primary reflector 7, both units 5A and 5B appear to have a mushroom-like body 64 which may be formed with a leg 62 for facilitating mounting it in a standardized manner, in solar energy utilization systems. The legs 62 may house the unit mounting arrangement, the cell-holding portion and at least a part of the heat removal portion illustrated in FIG. 1.

Figure 3:
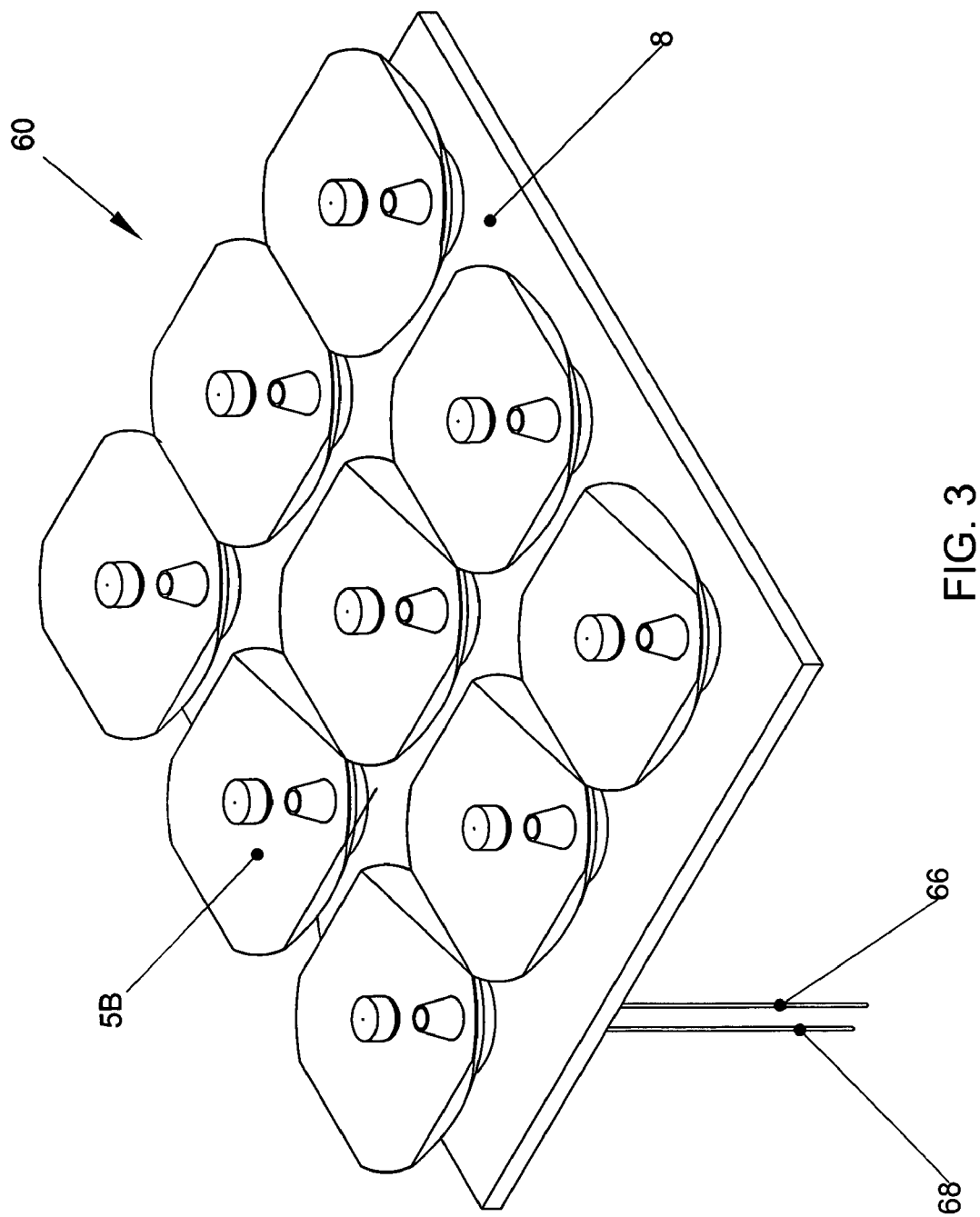
FIG. 3 is a schematic isometric view of a solar energy utilization system according to the present invention.

FIG. 3 shows an example of a solar energy utilization system 60 comprising the plate 8 and an array of units 5B attached thereto. The plate 8 is provided with any known tracking mechanism (not shown) to follow the sun.

The plate 8 is further provided with means 66 and 68 connected with inlets and outlets of the heat removal portion of all the units to enable the circulation of cooling fluid through the units 5B, as previously shown. The cooling fluid, when withdrawn from the units, may be further used for any suitable purpose.

The units designed according to the present invention may easily be individually replaced, when needed, thereby facilitating the maintenance of the system.

It can be appreciated that there are various solar energy utilization units and solar energy utilization systems devisable according to the present invention and that the above descriptions are merely explanatory. Thus, the solar energy utilization unit and solar energy utilization system can be embodied in a variety of aspects, falling within the scope of the present invention *mutatis mutandis*.

The invention claimed is:

1. A solar energy utilization unit comprising a solar radiation concentrating optics and a solar radiation receiver including first and second receiver components, the first receiver component being designed to convert into electric energy radiation in a first part of the solar spectrum, and the second receiver component being designed to convert into electric energy radiation in a second part of the solar spectrum different from said first part, said solar radiation concentrating optics comprising a concave primary reflector and a convex secondary reflector, the primary reflector being adapted to reflect incident solar radiation towards the secondary reflector, the secondary reflector being adapted to reflect radiation in said first part of the solar spectrum into said first receiver component and to transmit radiation in the second part of the solar spectrum into the second receiver component, said primary reflector being formed with a centrally disposed opening via which said first receiver component is adapted to receive the radiation reflected by said secondary receiver, wherein said solar utilization unit further comprises a cover formed with an aperture adapted to receive therein said second receiver component and said secondary reflector, such that said second receiver component extends outwardly from said cover and said secondary reflector extends inwardly from said cover towards said primary reflector.

2. A solar energy utilization unit according to claim 1, wherein both first and second receiver components comprise respective first and second photo-voltaic structures.

3. A solar energy utilization unit according to claim 2, wherein said first and second parts of the solar spectrum are its visible and IR parts.

4. A solar energy utilization unit according to claim 3, wherein said first part of the solar spectrum is the visible part, and said second part of the solar spectrum is the IR part.

5. A solar energy utilization unit according to claim 2, wherein at least one of the first and second receiver components comprise a non-imaging concentrator for forwarding incident concentrated radiation to the corresponding photo-voltaic structure in a uniformly distributed maimer.

6. A solar energy utilization unit according to claim 1, wherein said cover is adapted for covering the entire reflecting surface of said primary reflector, and holding the secondary reflector at a predetermined position relative to the primary reflector and the first and second receiver components.

7. A solar energy utilization unit according to claim 1, wherein a volume, formed between the cover, the primary reflector and the solar radiation receiver components, is sealed.

8. A solar energy utilization unit according to claim 7, wherein said volume contains an inert gas.

9. A solar energy utilization unit according to claim 1, wherein said unit comprises a self-aligning mechanism for directing the unit toward incoming solar radiation.

10. A solar energy utilization unit according to claim 2, wherein said first receiver component comprises the photo-voltaic structure and a heat removal portion adjacent thereto, the heat removal portion being either active or passive.

11. A solar energy utilization unit according to claim 2, wherein said second receiver component comprises the photo-voltaic structure and a housing protecting and insulating said structure and providing passive cooling.

12. A solar energy utilization unit according to claim 10, wherein said heat removal portion extends inwardly from said primary reflector.

13. A solar energy utilization unit according to claim 1, wherein the unit is of dimensions allowing it to be held, carried and manipulated by hand.

14. A solar energy utilization unit according to claim 12, wherein said heat removal portion is formed with a cooling fluid cavity.

15. A solar energy utilization unit according to claim 14, wherein said heat removal portion is located in the shade cast by said secondary reflector.

16. A solar energy utilization unit according to claim 11, wherein said housing extends outwardly from said cover to enable passive cooling.

17. A solar energy utilization system, comprising at least one seat and at least one solar energy utilization unit according to claim 1, detachably attachable thereto.

* * * * *